United States Patent
Masuda et al.

(10) Patent No.: US 7,432,760 B2
(45) Date of Patent: Oct. 7, 2008

(54) DIGITAL AMPLIFIER APPARATUS AND METHOD OF MUTING DIGITAL AMPLIFIER APPARATUS

(75) Inventors: Toshihiko Masuda, Tokyo (JP); Yusuke Yamamoto, Kanagawa (JP); Arihiro Moroboshi, Tokyo (JP)

(73) Assignee: Sony Corporation (JP)

( * ) Notice: Subject to any disclaimer, the term of this patent is extended or adjusted under 35 U.S.C. 154(b) by 102 days.

(21) Appl. No.: 11/643,627

(22) Filed: Dec. 21, 2006

(65) Prior Publication Data
US 2007/0188220 A1 Aug. 16, 2007

(30) Foreign Application Priority Data
Dec. 28, 2005 (JP) .................... P2005-380367

(51) Int. Cl.
H03F 3/38 (2006.01)
(52) U.S. Cl. ....................................... 330/10
(58) Field of Classification Search ................. 381/94.5
See application file for complete search history.

(56) References Cited

U.S. PATENT DOCUMENTS 7,205,917 B2 * 4/2007 Magrath ...................... 341/143
2007/0005160 A1 * 1/2007 Zaucha et al. ................. 700/94

FOREIGN PATENT DOCUMENTS

JP 2004-336765 A 11/2004

* cited by examiner

Primary Examiner—Steven J Mottola
(74) Attorney, Agent, or Firm—Lerner, Davis, Littenberg, Krumholz & Mentlik, LLP

(57) ABSTRACT

A digital amplifier apparatus includes a gain-adjusting section operable to adjust a gain of a digital audio signal; a dither-superposing section operable to superpose a predetermined dither on the digital audio signal; a pulse-width-modulated signal generating section operable to generate a pulse-width-modulated signal corresponding to the digital audio signal; an amplifying section operable to cause a switching element to perform a switching operation in accordance with the pulse-width-modulated signal; a pulse-width changing section operable to change a ratio between a "high" state and a "low" state of the pulse-width modulated signal; and a control section operable to perform a muting process by causing the gain-adjusting section to set the gain of the digital audio signal to a zero level, the dither-superposing section to stop superposing the dither, and the pulse-width changing section to change, step by step, the ratio between the "high" state and the "low" state of the pulse-width modulated signal toward the "low" state upon receipt of a predetermined muting signal for muting the digital audio signal, thereby maintaining the "low" state and stopping the switching operation performed in accordance with the pulse-width modulated signal.

8 Claims, 9 Drawing Sheets

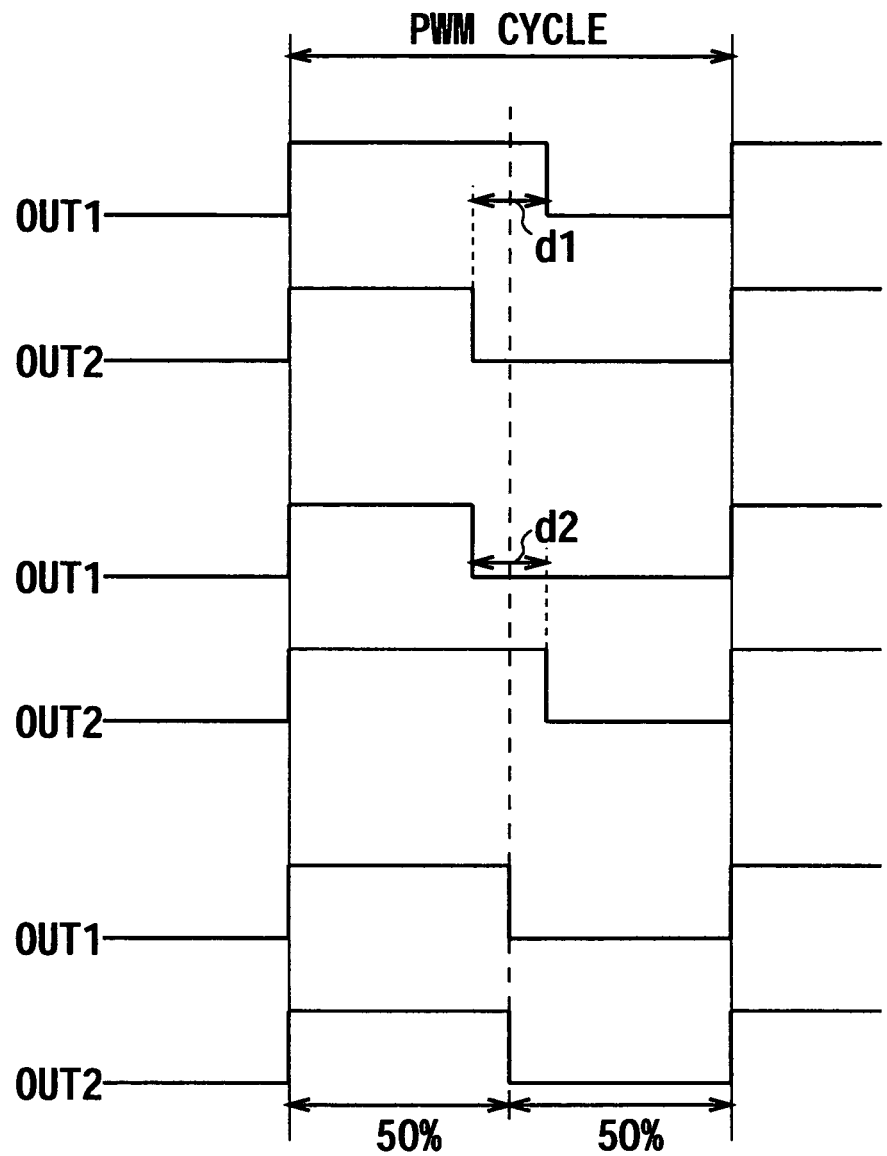

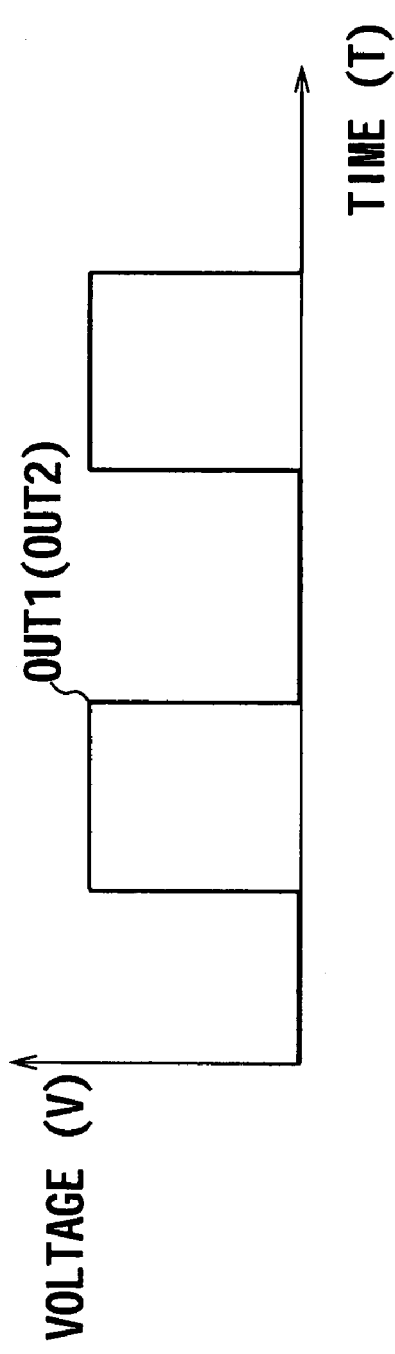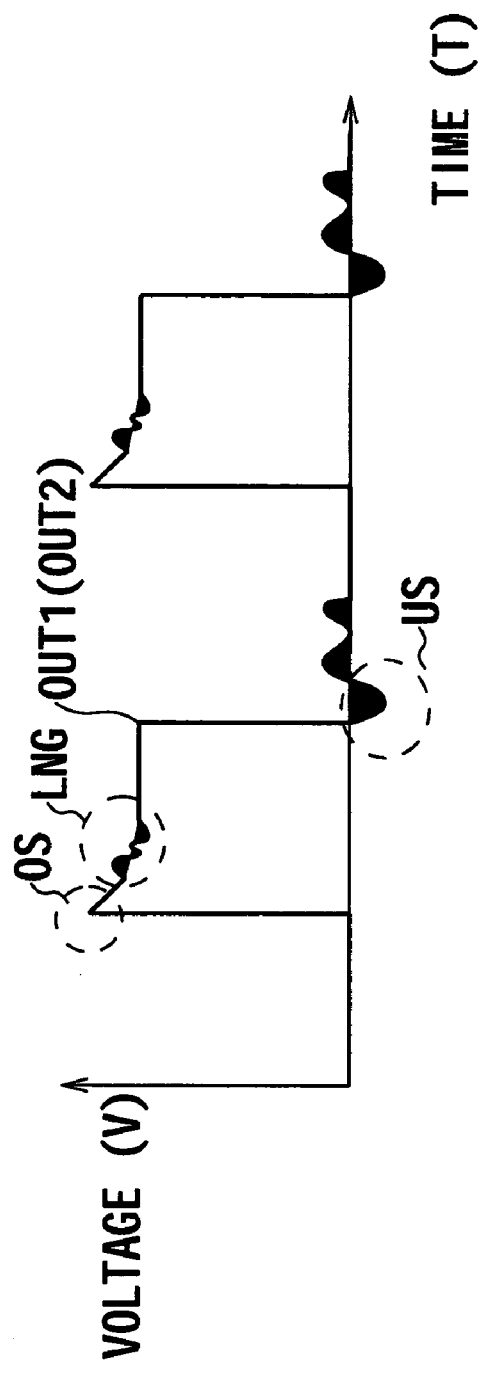
FIG.9A
FIG.9B

DIGITAL AMPLIFIER APPARATUS AND METHOD OF MUTING DIGITAL AMPLIFIER APPARATUS

CROSS-REFERENCE TO RELATED APPLICATIONS

The present application claims priority from Japanese Patent Application No. JP2005-380367 filed on Dec. 28, 2005, the disclosure of which is hereby incorporated by reference herein.

BACKGROUND OF THE INVENTION

1. Field of the Invention

The present invention relates to a digital amplifier apparatus and a method of muting a digital amplifier apparatus. The invention is suitable for application to digital amplifiers (D-class amplifiers) of, for example, Pulse-Width Modulation (PWM) type.

2. Description of the Related Art

Hitherto, with audio apparatuses incorporating a digital amplifier, the user may push the mute button, thus performing a muting operation, while the speaker is generating sound. Then, the speaker must be forcedly stopped, ceasing to generate sound.

At the time the user performs the muting operation, the two PWM outputs of the BTL-connected amplifier circuit are set in the same phase and at a duty ratio of 50% (i.e., "low" state and "high" state being of the same ratio). As a result, the speaker connected to the amplifier circuit stops generating audio outputs.

More specifically, as shown in FIG. 7, a PWM-signal amplifying unit 1 receives a PWM signal P1(+) supplied from a PWM-signal generating circuit (not shown) provided in the stage preceding the unit 1. In the PWM-signal amplifying unit 1, the PWM signal P1(+) is supplied to the gate of a transistor Tr1 that is a Metal Oxide Semiconductor-Field Effect Transistor (MOS-FET). Meanwhile, a PWM signal P1(−) is supplied to the gate of a transistor Tr2 that is a MOS-FET. Therefore, the transistor Tr1 and the transistor Tr2 are alternately turned on and off.

Similarly, in the PWM-signal amplifying unit 1, a PWM signal P2(+) supplied from the PWM-signal generating circuit is applied to the gate of a transistor Tr3 that is a MOS-FET, and a PWM signal P2(−) is supplied to the gate of a transistor Tr4 that is a MOS-FET. Therefore, the transistor Tr3 and the transistor Tr4 are alternately turned on and off.

Thus, in the PWM-signal amplifying unit 1, when the transistor Tr1 and the transistor Tr2 are turned on and off, respectively, and the transistor Tr3 and the transistor Tr4 are turned off and on, respectively, a drive current iA that corresponds to the PWM output OUT1 of the transistors Tr1 and Tr is supplied via a low-pass filter LPF1 to a speaker SP.

In the PWM-signal amplifying unit 1, too, when the transistor Tr3 and the transistor Tr4 are turned on and off, respectively, and the transistor Tr1 and the transistor Tr are turned off and on, respectively, a drive current iB that corresponds to the PWM output OUT2 of the transistors Tr3 and Tr4 is supplied via a low-pass filter LPF2 to the speaker SP.

That is, in the PWM-signal amplifying unit 1, potential differences d1 and d2 develop between the PWM output OUT1 and the PWM output OUT2 as shown in FIGS. 8A and 8B if the PWM output OUT1 and PWM output OUT2 have different duty ratios. The drive currents iA and iB, which correspond to the PWM outputs OUT1 and OUT2, respectively, flow to the speaker SP. As a result, the speaker SP generates sound.

In the PWM-signal amplifying unit 1, no potential difference develops between the PWM output OUT1 and PWM output OUT2 as shown in FIG. 8C if the PWM output OUT1 and PWM output OUT2 have the same duty ratio of 50% and are completely in the same phase. In this case, neither drive current iA nor drive current iB flows to the speaker SP. Hence, the speaker SP stops generating sound. A muting operation is thereby accomplished.

In the PWM-signal amplifying unit 1, the transistors Tr1 and Tr2 are alternately turned on and off and the transistors Tr3 and Tr4 are alternately turned on and off (thus, performing switching), even while the muting operation continues. The waveforms of the PWM outputs OUT1 and OUT2 inevitably have strains such as an overshoot component OS, an undershoot component US, a ringing component LNG and the like, which may cause unnecessary radiation.

That is, the waveforms of the PWM outputs OUT1 and OUT2 generated as the PWM-signal amplifying unit 1 performs the switching are perfectly rectangular as shown in FIG. 9A if dv/dt (voltage change per unit time) is infinitely great. In reality, dv/dt is limited. As shown in FIG. 9B, the outputs will inevitably contain strains such as an overshoot component OS, an undershoot component US, a ringing component LNG and the like, which may cause unnecessary radiation.

In view of this, the switching may not be performed in accomplishing the muting operation. In this method, the PWM outputs OUT1 and OUT2 are forcedly set to the "low" state when the user performs muting operation while the speaker is generating sound.

However, the audio output will become discontinuous as shown in FIG. 1 in the PWM-signal amplifying unit 1, if the PWM outputs OUT1 and OUT2 are abruptly set to the "low" state while the audio output is being generated with a potential difference imposed between them.

An audio-signal generating apparatus and an audio-signal generating method, both designed to reduce pop noise, are known. In the apparatus and method, the widths of pulses in the "high" state are reduced for the PWM outputs OUT1 and OUT2 during the muting operation. (See, for example, Jpn. Pat. Appln. Laid-Open Publication No. 2004-336765)

In the method described above, the on-period over the pulse width is short for the PWM outputs OUT1 and OUT2. Nonetheless, the possibility that a large pop noise is generated is low because the PWM outputs OUT1 and OUT2 are held in the "low" state while the audio output is being generated. However, a small pop noise is inevitably generated.

The present invention has been made in consideration of the foregoing and proposes a digital amplifier apparatus and a method of muting a digital amplifier apparatus, each capable of performing a muting process without generating unnecessary radiation or noise.

SUMMARY OF THE INVENTION

To overcome the above case, the gain of a digital audio signal is adjusted in an embodiment of the present invention. A predetermined dither is added to the digital audio signal, and a pulse-width modulated signal corresponding to the digital audio signal having the dither is then generated. In accordance with the pulse-width modulated signal, the switching elements of an amplifying section are operated, thereby performing amplification. At this time, a muting command may be recognized by receiving a predetermined muting signal. In this case, the gain of the digital audio signal is set to a zero level, and the superposing of the dither is stopped. Then, a pulse-width modulated signal corresponding to the digital audio signal with the gain thus adjusted is generated. The periods for which the pulse-width modulated signal remain in a "high" state and a "low" state, respectively, are changed step by step, gradually shortening the "high"-state period. The pulse-width modulated signal is thereby maintained in the "low" state in its entirety, thereby stopping the switching operation.

Hence, the gain of the digital audio signal is set to an anacoustic level, thereby stopping the superposing of the dither, when the receipt of a muting command is recognized while sound is being generated. A pulse-width modulated signal at an anacoustic level is thereby generated. The periods for which the pulse-width modulated signal remain in a "high" state and a "low" state, respectively, are changed step by step, finally fixing the signal in the "low" state, thus accomplishing muting. Accordingly, a sound-generating section can be shifted from the soundgenerating state to the muting state without generating noise.

According to the present invention, it is possible to realize a digital amplifier apparatus and a method of muting a digital amplifier apparatus, in which the gain of a digital audio signal is set to an anacoustic level, thereby stopping the superposing of a dither, when a muting command is recognized to have been abruptly supplied while sound is being generated, and the periods for which the pulse-width modulated signal remain in a "high" state and a "low" state, respectively, are changed step by step, finally fixing the signal in the "low" state. Hence, neither unnecessary radiation nor noise is generated. Therefore, the apparatus and method can perform a muting operation without generating sound unpleasant to the user.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 8A to 8C are diagrams explaining how the duty ratios of PWM outputs change; and FIGS. 9A and 9B are diagrams showing the waveforms that PWM outputs have as switching is performed.

DETAILED DESCRIPTION

An embodiment of the present invention will be described, with reference to the accompanying drawings.

(1) Configuration of the Digital Amplifier Apparatus

Figure 1:
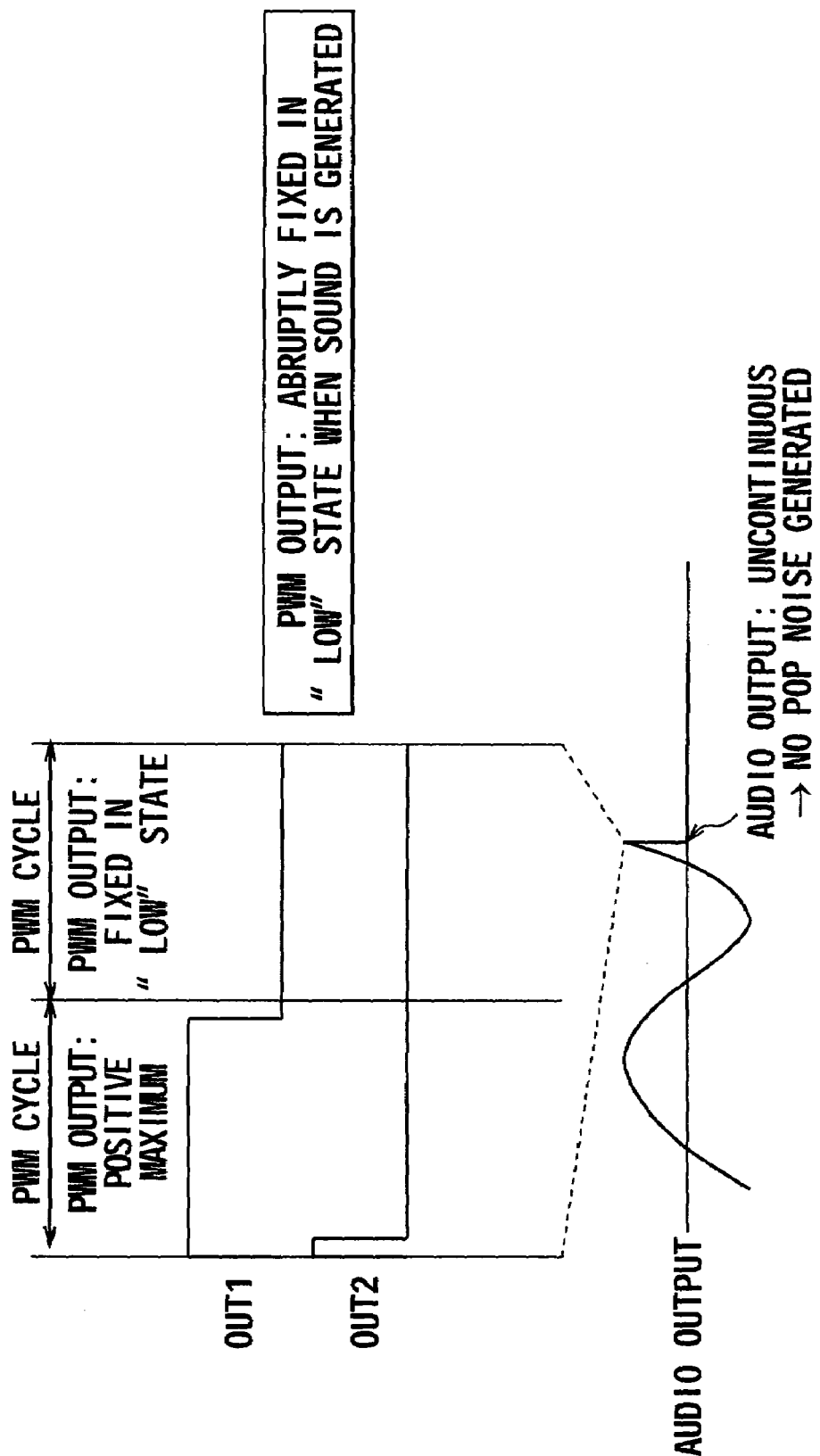
FIG. 1 is a diagram illustrating the mute timing in the conventional apparatus.
Figure 2:
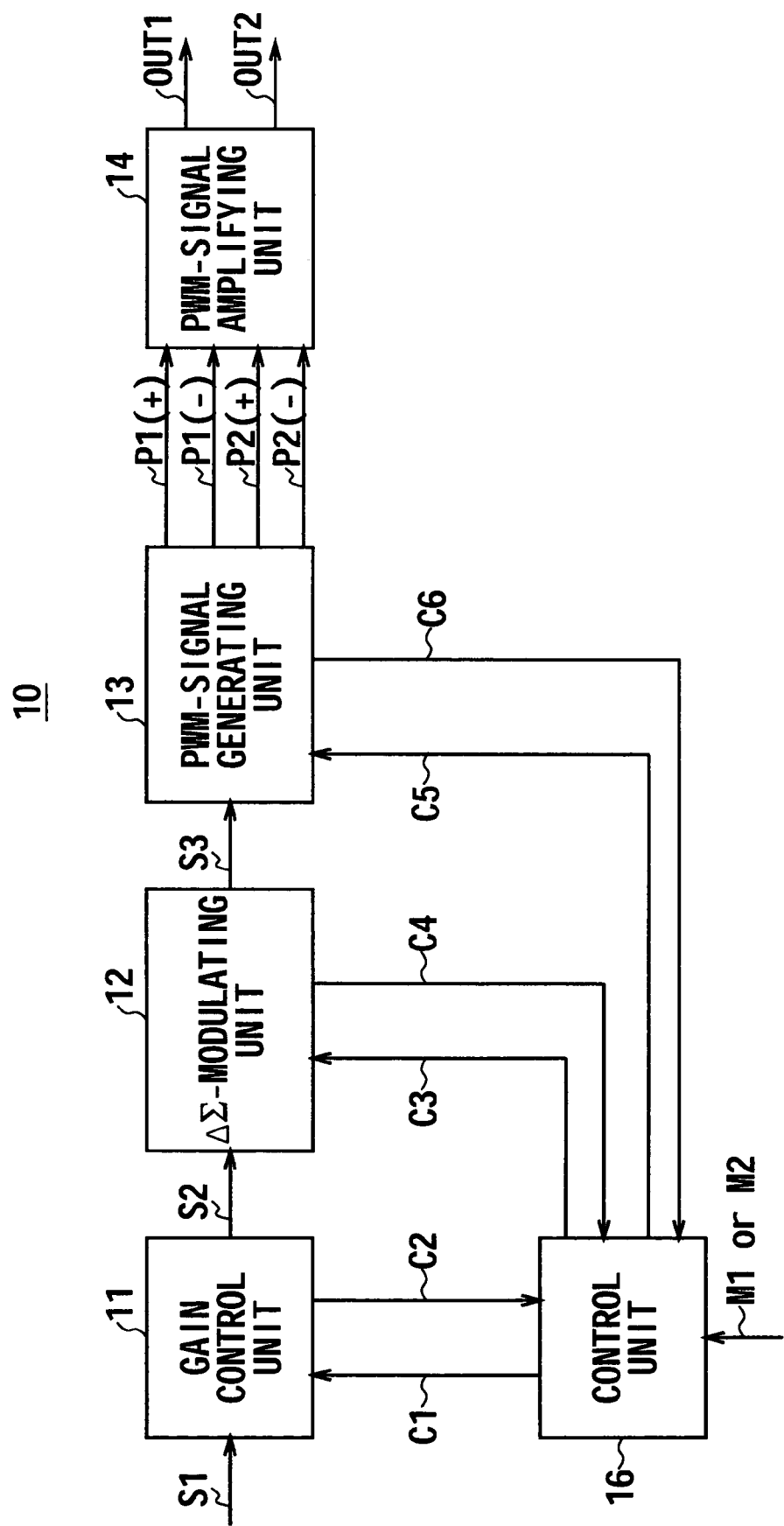
FIG. 2 is a schematic block diagram showing the configuration of a digital amplifier apparatus according to an embodiment of the present invention.

FIG. 2 shows a digital amplifier apparatus 10 according to this invention. A control unit 16 constituted by a Central Processing Unit (CPU) controls the other components of the apparatus 10. The apparatus 10 includes a gain control unit 11, a $\Delta\Sigma$-modulating unit 12, a PWM-signal generating unit 13, and a PWM-signal amplifying unit 14.

(1-1) Normal Mode

While the digital amplifier apparatus 10 is operating in the normal mode, a Pulse-Code Modulation (PCM) signal S1 reproduced from, for example, a Compact Disc (CD) is input to the gain control unit 11.

The gain control unit 11 performs gain adjustment, either amplifying or attenuating the PCM signal S1 to a predetermined level, generating a PCM signal S2. The PCM signal S2 is supplied to the $\Delta\Sigma$-modulating unit 12.

The $\Delta\Sigma$-modulating unit 12 performs bit-length changing on the PCM signal S2 supplied from the gain control unit 11, which is, for example, a 16-bit signal, converting the signal S2 to a signal consisting of fewer bits. Further, the $\Delta\Sigma$-modulating unit 12 performs so-called noise shaping, thereby accomplishing $\Delta\Sigma$modulation. The unit 12 then superposes a dither (namely, performing a so-called dither-on) on the signal, and generates $\Delta\Sigma$-modulated data S3. The $\Delta\Sigma$-modulated data S3 is supplied to the PWM-signal generating unit 13.

The dither is a signal component (noise component) of a higher frequency than that of the $\Delta\Sigma$-modulated data S3. Once this signal component is superposed on the $\Delta\Sigma$-modulated data S3, the S/N ratio will be smaller. Nevertheless, the strain that is aurally undesirable is reduced, improving the quality of sound.

Figure 7:
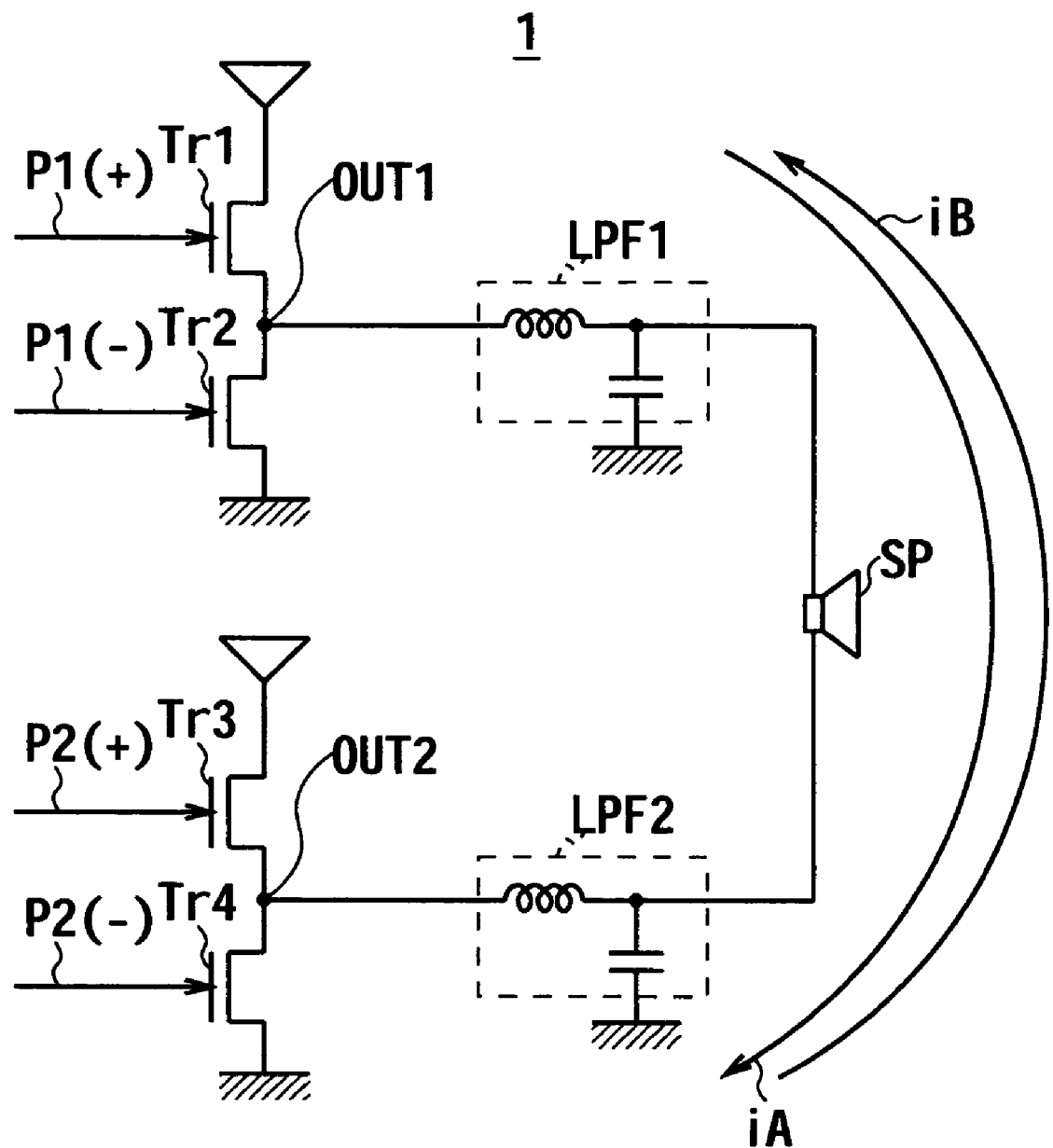
FIG. 7 is a diagram showing the configuration of a PWM-signal amplifying unit.

The PWM-signal generating unit 13 generates, from the modulated data S3, PWM signals P1(+), P1(−), P2(+) and P2(−) for switching the transistors Tr1 to Tr4 of the PWM-signal amplifying unit 14, because the PWM-signal amplifying unit 14 is of Bridge-Tied Load(BTL) type, as shown in FIG. 7. The PWM signals thus generated are supplied to the PWM-signal amplifying unit 14.

In the PWM-signal amplifying unit 14, the PWM signal P1(+) is supplied to the gate of the transistor Tr1, turning on the transistor Tr1. At this time, the PWM signal P1(+), which is opposite in phase to PWM signals P1(−), is supplied to the gate of the transistor Tr2, turning off the transistor Tr2. Further, the PWM signal P2(−) is applied to the gate of the transistor Tr4, turning on the transistor Tr4. At this time, a PWM signal P2(−), which is opposite in phase to the PWM signal P2(+), is applied to the gate of the transistor Tr3, turning off the transistor Tr3. As a result, as shown in FIG. 8A, a difference is imposed between the duty ratio of the PWM output OUT1 generated by the transistors Tr1 and Tr2 and the duty ratio of the PWM output OUT2 generated by the transistors Tr3 and Tr4. A current iA corresponding to the resultant potential difference is made to flow to the speaker SP, which generates sound.

Further, in the PWM-signal amplifying unit 14, the PWM signal P1(−) is applied to the gate of the transistor Tr2, turning on the transistor Tr2. At this time, the PWM signal P1(−), which is opposite in phase to PWM signals P1(+), is applied to the gate of the transistor Tr1, turning off the transistor Tr1. Further, the PWM signal P2(+) is supplied to the gate of the transistor Tr3, turning on the transistor Tr3. At this time, the PWM signal P2(−), which is opposite in phase to PWM signals P2(+), is applied to the gate of the transistor Tr4, turning off the transistor Tr4. As a result, such a difference as shown in FIG. 8B is imposed between the duty ratio of the PWM output OUT1 generated by the transistors Tr1 and Tr2 and the duty ratio of the PWM output OUT2 generated by the transistors Tr3 and Tr4. A current iB corresponding to the resultant potential difference is made to flow to the speaker SP, which generates sound.

In the digital amplifier apparatus 10, when the user pushes the mute button to perform the muting operation, while the speaker SP is generating sound in the normal mode, a muting signal M1 is supplied to the control unit 16 to make the speaker SP stop generating sound. The signal M1 is used as a trigger, switching the operating mode of the apparatus 10 from the normal mode to the muting mode.

(1-2) Muting Mode

Figure 3:
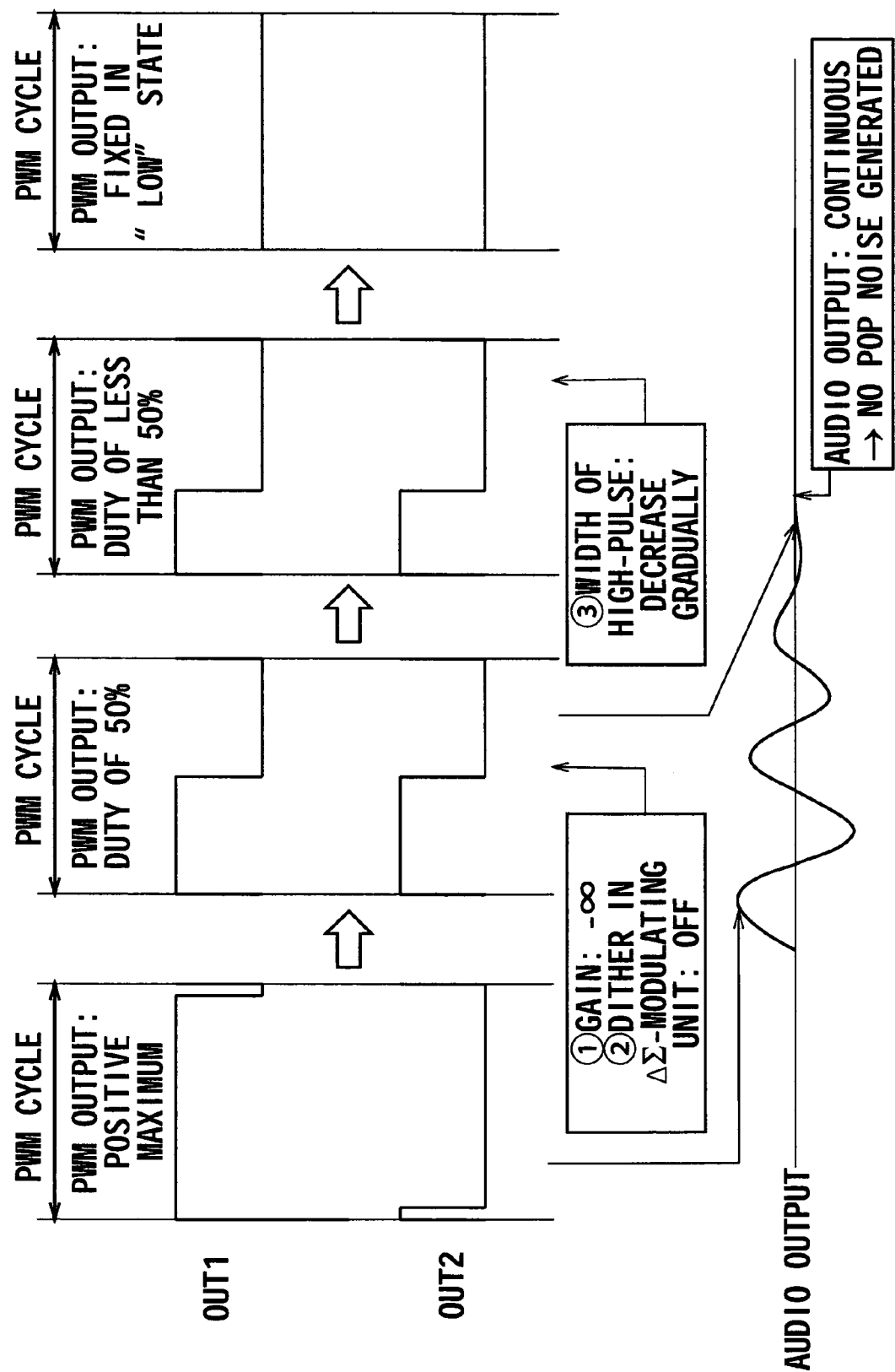
FIG. 3 is a diagram representing the mute timing according to the embodiment of the present invention.

As shown in FIG. 3, in the digital amplifier apparatus 10, the muting signal M1 may be supplied to the control unit 16 when user pushes the mute button to perform the muting operation, while the speaker SP is generating sound in the normal mode because a difference is imposed between the duty ratio of the PWM output OUT1 and that of the PWM output OUT2. In this case, the operation mode of the apparatus 10 changes from the normal mode to the muting mode.

When the operating mode changes to the muting mode, the control unit 16 of the digital amplifier apparatus 10 supplies a control signal C1 to the gain control unit 11, so that the gain of the PCM signal S1 may come to have value of $-\infty$.

In accordance with the control signal C1 supplied from the control unit 16, the gain control unit 11 adjusts the gain of the PCM signal S1 to $-\infty$.

The gain control unit 11 multiplies the PCM signal S1 by a coefficient "0", attenuating the PCM signal S1 to the anacoustic level, generating an anacoustic-level PCM signal S2. The anacoustic-level PCM signal S2 is supplied to the $\Delta\Sigma$-modulating unit 12. Further, the gain control unit 11 generates a process-result signal C2 to the control unit 16, informing the control unit 16 that the gain has been so adjusted.

Upon receipt of the process-result signal C2 from the gain control unit 11, the control unit 16 supplies a control signal C3 to the $\Delta\Sigma$-modulating unit 12, causing the unit 12 to perform $\Delta\Sigma$-modulation on the PCM signal S2.

The $\Delta\Sigma$-modulating unit 12 receives the control signal C3. In the muting mode, the unit 12 does not superpose a dither (not performing the so-called dither-on) as in the normal mode. Rather, the $\Delta\Sigma$-modulating unit 12 performs $\Delta\Sigma$-modulation on the PCM signal S2, generating $\Delta\Sigma$-modulated data S3. The data S3 is supplied to the PWM-signal generating unit 13. Moreover, the $\Delta\Sigma$-modulating unit 12 supplies an end signal C4 to the control unit 16, informing that the $\Delta\Sigma$-modulated data S3 has been supplied to the PWM-signal generating unit 13.

The gain control unit 11 adjusts the gain of the $\Delta\Sigma$-modulated data S3 to an anacoustic level. Not superposed with a dither, the $\Delta\Sigma$-modulated data S3 is completely at the anacoustic level.

Hence, the duty ratios of the PWM output OUT1 obtained by switching the transistors Tr1 and Tr2 in accordance with the PWM signals P1(+) and P1(–) generated from the $\Delta\Sigma$-modulated data S3 at the completely anacoustic level and the PWM output OUT2 obtained by switching the transistors Tr3 and Tr4 in accordance with the PWM signals P2(+) and P2(–) generated from the $\Delta\Sigma$-modulated data S3 at the completely anacoustic level, are 50%, and the PWM outputs OUT1 and OUT2 are in the same phase. As a result, neither the drive current iA nor the drive current iB (FIG. 7) flows to the speaker SP. Thus, the speaker SP can be stopped, not generating outputs at all (FIG. 3).

However, unnecessary radiation may occur in the digital amplifier apparatus 10. This is because the transistors Tr1 and Tr2 are switched in accordance with the PWM signals P1(+) and P1(–), and the transistors Tr3 and Tr4 are switched in accordance with the PWM signals P2(+) and P2(–).

Upon receiving the end signal C4, the control unit 16 supplies a command signal C5 to the PWM-signal generating unit 13, so that the PWM signals P1(+),P1(–), P2(+) and P2(–) may be set to the "low" state.

Upon receiving the command signal C5, the PWM-signal generating unit 13 changes the period for which the PWM signals P1(+) and P1(–) stay in the "high" state and the period for which the PWM signals P2(+) and P2(–) remain in the "low" state, thereby decreasing the duty ratios of the PWM outputs OUT1 and OUT2 at a predetermined rate while the PWM outputs OUT1 and OUT2 remain in the same phase. The outputs OUT1 and OUT2 are then supplied to the PWM-signal amplifying unit 14 (FIG. 3).

Before supplying the PWM signals P1(+), P1(–), P2(+) and P2(–), the PWM-signal generating unit 13 determines whether the PWM signals P1(+), P1(–), P2(+) and P2(–) are all in the "low" state. If all signals are not in the "low" state, the above-mentioned process is repeated until all these signals assume the "low" state.

If all signals are in the "low" state, the PWM-signal generating unit 13 supplies the PWM signals P1(+), P1(–), P2(+) and P2(–) to the PWM-signal amplifying unit 14. Further, the PWM-signal generating unit 13 supplies, to the control unit 16, an end signal C6 indicating that the PWM-signals have been changed.

At this point, the PWM signals P1(+) and P1(–) are completely in the "low" state in the PWM-signal amplifying unit 14. No gate voltage is therefore applied to the gates of the transistors Tr1 and Tr2 of the PWM-signal amplifying unit 14. Thus, the transistors Tr1 and Tr2 stop performing the switching operation, whereby the PWM output OUT1 is set into the "low" state.

The PWM signals P2(+) and P2(–) are completely in the "low" state, too, in the PWM-signal amplifying unit 14. No gate voltage is therefore applied to the gates of the transistors Tr3 and Tr4 of the PWM-signal amplifying unit 14. Thus, the transistors Tr3 and Tr4 are turned off and stop performing the switching operation. The PWM output OUT2 is thereby set into the "low" state.

Hence, in the digital amplifier apparatus 10, both PWM outputs OUT1 and OUT2 are all set in the "low" state. The supply of the drive currents iA and iB to the speaker SP from the PWM-signal amplifying unit 14 is stopped. The speaker SP perfectly stops generating sound.

(1-3) Releasing of the Muting

While the digital amplifier apparatus 10 remains in the muting mode, the user may release the muting mode at an arbitrary timing. If this case, a muting-release signal M2 is supplied to the control unit 16. Then, the muting mode is released, whereby the operating mode is switched from the muting mode to the normal mode.

On receiving the muting-release signal M2, the control unit 16 of the digital amplifier apparatus 10 supplies a control signal C5 to the PWM-signal generating unit 13 so as the unit 13 generate PWM signals from the $\Delta\Sigma$-modulated data S3.

Upon receipt of the control signal C5, the PWM-signal generating unit 13 supplies the PWM signals P1(+), P1(–), P2(+) and P2(–) generated from the $\Delta\Sigma$-modulated data S3 to the PWM-signal amplifying unit 14, and supplies to the control unit 16 an end signal C6 indicating that the generation of the PWM-signals have been completed.

As a result, all PWM signals P1(+), P1(−), P2(+) and P2(−) are no longer in the "low" state. The PWM outputs OUT1 and OUT2 have a duty ratio of 50% and the same phase.

Upon receipt of the end signal C6, the control unit 16 supplies a command signal C3 to the ΔΣ-modulating unit 12, causing the unit 12 to perform ΔΣ-modulation on the PCM signal S2.

Unlike in the muting mode, the ΔΣ-modulating unit 12 performs ΔΣ-modulation on the PCM signal S2 (that is, the unit 12 performs the dither-on), generating ΔΣ-modulated data S3. The ΔΣ-modulated data S3 is supplied to the PWM-signal generating unit 13. Further, the ΔΣ-modulating unit 12 supplies an end signal C4 to the control unit 16, informing that the ΔΣ-modulated data S3 has been supplied to the PWM-signal generating unit 13.

The gain of the ΔΣ-modulated data S3 has been adjusted to an anacoustic level by the gain control unit 11, but not to a completely anacoustic level. This is because the data S3 is not superposed with a dither.

On receiving the end signal C4, the control unit 16 supplies the control signal C1 to the gain control unit 11, so that the gain of the PCM signal S1 may come to have a value other than −∞.

The gain control unit 11 adjusts the gain of the PCM signal S1 in accordance with the control signal C1 supplied from the control unit 16. At this point, the unit 11 adjusts the gain to a predetermined value other than −∞. Then, the unit 11 supplies an end signal C2 to the control unit 16, informing that the adjustment has been completed.

That is, the gain control unit 11 performs gain adjustment, either amplifying or attenuating the PCM signal S1 to a prescribed level, thus obtaining a PCM signal S2. The PCM signal S2 is supplied to the ΔΣ-modulating unit 12.

Upon receipt of the end signal C2, the control unit 16 terminates the muting-release process. In the next PWM cycle, the control unit 16 imposes a difference between the PWM outputs OUT1 and OUT2 and supplies the drive currents iA and iB to the speaker SP. The speaker SP therefore starts generating sound again.

(2) Sequence of the Muting Process

Figure 4:
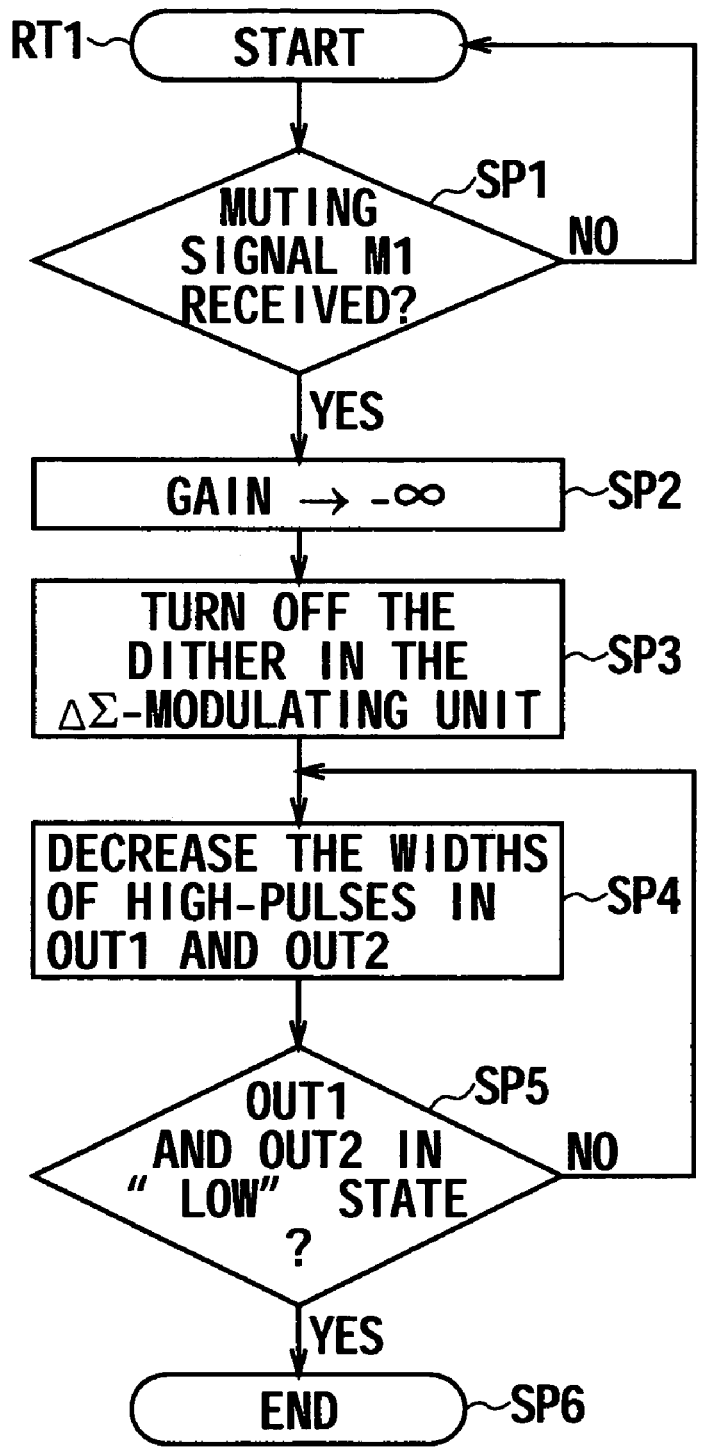
FIG. 4 is a flowchart illustrating the sequence of a muting process according to the embodiment of the present invention.

The sequence of the muting process that is performed while the digital amplifier apparatus 10 is set in the muting mode will be explained, with reference to the flowchart of FIG. 4.

The control unit 16 of the digital amplifier apparatus 10 starts operating in the start step of routine RT1. The control unit 16 then goes to Step SP1. In Step SP1, the control unit 16 determines whether the muting signal M1 has been received. If NO, the control unit 16 waits for the muting signal M1 and performs the normal-mode processes. If YES in Step SP1, the control unit 16 recognizes a muting command and goes to the next step, i.e., Step SP2.

Having received the muting signal M1 in Step SP2, the control unit 16 causes the gain control unit 11 to adjust the gain of the PCM signal S1 to the value of −∞. Thus, the unit 11 attenuates the PCM signal S1 to an anacoustic level, thus generating a PCM signal S2. Then, the control unit 16 goes to the next step, i.e., Step SP3.

In Step SP3, the control unit 16 causes the ΔΣ-modulating unit 12 to perform ΔΣ-modulation on the PCM signal S2 and turns off the dither, generating ΔΣ-modulated data S3 at the anacoustic level. Then, the control unit 16 goes to the next step, i.e., Step SP4.

In Step SP4, the control unit 16 changes the period for which the PWM signals P1(+), P1(−), P2(+) and P2(−) remain in the "high" state and the "low" state, to decrease the duty ratio of the PWM output OUT1 generated by the transistors Tr1 and Tr2 and the duty ratio of the PWM output OUT2 generated by the transistors Tr3 and Tr4. That is, the "high"-state period is shortened. Then, the control unit 16 goes to the next step, i.e., Step SP5.

In Step SP5, the PWM-signal generating unit 13 determines whether OUT1 and OUT2 are in the "low" state, in accordance with whether all PWM signals P1(+), P1(−), P2(+) and P2(−) are in the "low" state. If NO, the PWM-signal generating unit 16 returns to Step SP4.

If YES in Step SP5, the control unit 16 uses the PWM signals P1(+), P1(−), P2(+) and P2(−), stopping the operation of the transistors Tr1 to Tr4 of the PWM-signal amplifying unit 14. Thus, the transistors Tr1 and Tr2 no longer perform switching operation, and the transistors Tr3 and Tr4 no longer perform switching operation. The control unit 16 then goes to Step SP6, in which the muting process is terminated.

(3) Operation and Advantage

In the digital amplifier apparatus 10 of the configuration described above, PWM signals P1(+), P1(−), P2(+) and P2(−) are generated from the ΔΣ-modulated data S3 whose gain is adjusted to the anacoustic level and which undergoes a dither-off process when the muting signal M1 is received. Nonetheless, the states of the PWM signals P1(+), P1(−), P2(+) and P2(−) and the periods for which these PWM signals remain in the "high" state and the "low" state are changed stepwise, gradually shortening the "high"-state period. All PWM signals P1(+), P1(−), P2(+) and P2(−) are thereby fixed in the "low" state, stopping the switching operation of the PWM-signal amplifying unit 14. Thus, neither the drive current iA nor the drive current iB is supplied to the speaker SP.

In the digital amplifier apparatus 10, the operation of the transistors Tr1 to Tr4 of the PWM-signal amplifying unit 14 are stopped when all PWM signals P1(+), P1(−), P2(+) and P2(−) come into the "low" state. The PWM outputs OUT1 and OUT2 are therefore set into the "low" state. Therefore, the supply of any drive current, current iA or current iB, to the speaker SP can therefore be stopped. Hence, even if the muting operation is abruptly performed while the speaker SP is generating sound, the muting operation can be continued, without generating pop noise.

Since the digital amplifier apparatus 10 generates PWM signals P1(+), P1(−), P2(+) and P2(−) from the ΔΣ-modulated data S3 that is at a completely anacoustic level. The speaker SP can therefore stop generating sound at the time when both PWM outputs OUT1 and OUT2 come to have the same phase and a duty ratio of 50%. At this time, however, the switching operation is still proceeding. Hence, the PWM signals P1(+), P1(−), P2(+) and P2(−) are set, step by step, into the perfectly "loW" state, thereby stopping the switching operation. This can suppress the generation of unnecessary radiation.

Unlike the conventional apparatus, the digital amplifier apparatus 10 of the configuration described above does not perform the muting operation while the speaker is generating sound. The apparatus 10 generates ΔΣ-modulated data S3 that is at a completely anacoustic level, because its gain has been adjusted to the anacoustic level and has undergone the dither-off process, and sets the PWM outputs, step by step, into the "low" state. Hence, the muting operation can be performed, without generating sound unpleasant to the user.

(4) Other Embodiments

The embodiment described above, i.e., digital amplifier apparatus 10, is designed to set the PWM outputs OUT1 and OUT2, step by step, into the "low" state. The present invention is not limited to the embodiment, nevertheless. The PWM outputs OUT1 and OUT2 may be set into the "low" state when the PWM cycle ends after the gain and dither have been changed and rendered anacoustic.

Then, the switching need not be repeated so many times as in the case where the PWM outputs OUT1 and OUT2 are set, step by step, into the "low" state. This can help to reduce the unnecessary radiation.

Figure 5:
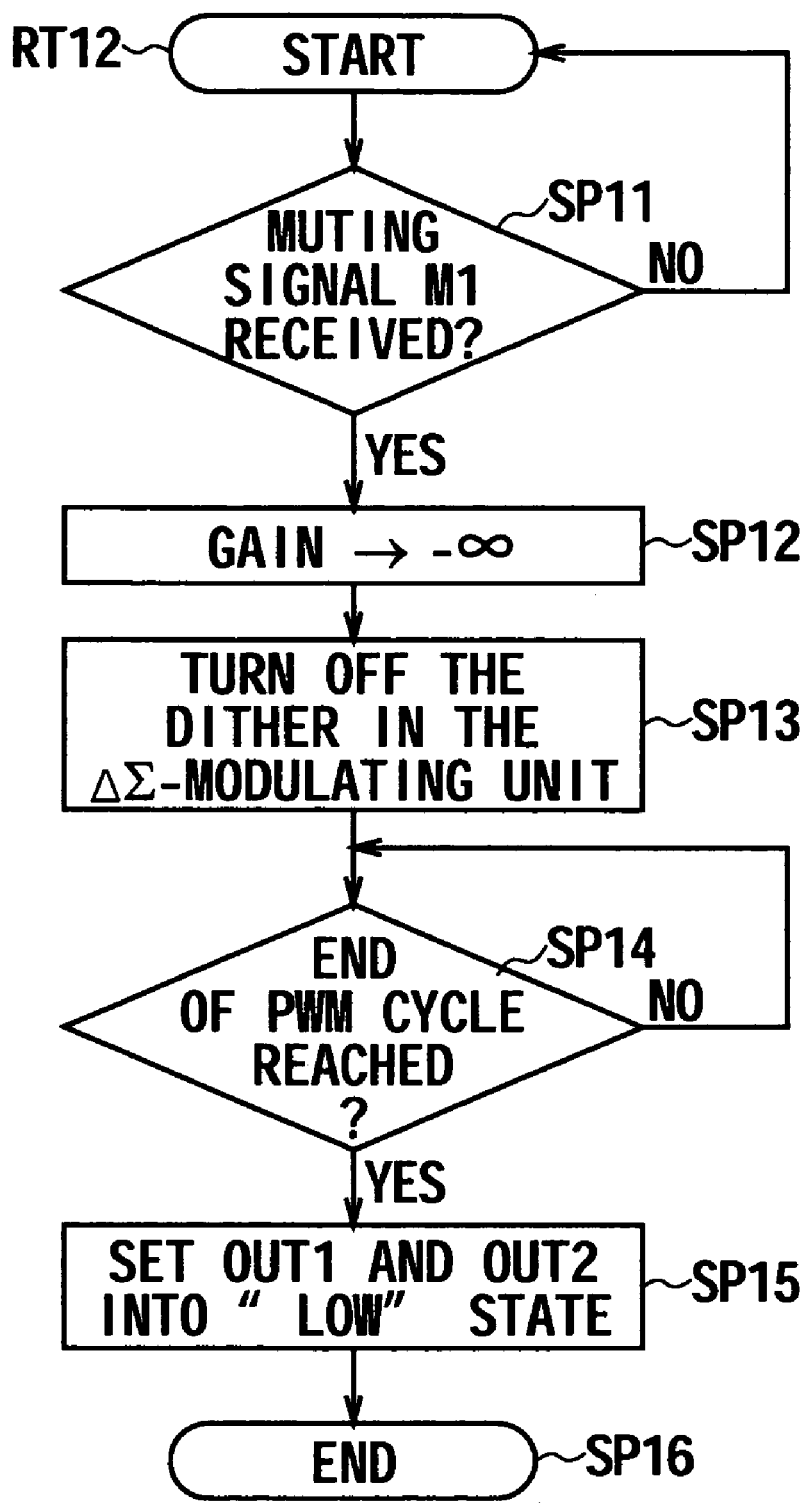
FIG. 5 is a flowchart illustrating the sequence of a muting process according to another embodiment of the present invention.

A method of setting the PWM outputs OUT1 and OUT2 are set into the "low" state at the end of the PWM cycle will be explained, with reference to FIG. 5.

The control unit 16 of the digital amplifier apparatus 10 starts operating in the start step of routine RT12. The control unit 16 then goes to Step SP11. In Step SP11, the control unit 16 determines whether the muting signal M1 has been received. If NO, the control unit 16 waits for the muting signal M1 and performs the normal-mode processes. If YES in Step SP11, the control unit 16 recognizes a muting command and goes to the next step, i.e., Step SP12.

Having received the muting signal M1 in Step SP12, the control unit 16 causes the gain control unit 11 to adjust the gain of the PCM signal S1 to the value of −∞. Thus, the unit 11 attenuates the PCM signal S1 to an anacoustic level, thus generating a PCM signal S2. Then, the control unit 16 goes to Step SP13.

In Step SP13, the control unit 16 causes the ΔΣ-modulating unit 12 to perform ΔΣ-modulation on the PCM signal S2 and turns off the dither, generating ΔΣ-modulated data S3 at the anacoustic level. Then, the control unit 16 goes to the next step, i.e., Step SP14.

In Step SP14, the PWM-signal generating unit 13 determines whether the PWM cycle has ended. If NO, the unit 13 waits until the PWM cycle ends. If YES, the unit 13 goes to the next step, i.e., Step SP1 5.

In Step SP11, the PWM-signal generating unit 13 sets the PWM signals P1(+), P1(−), P2(+) and P2(−) into the "low" state and then supplies the PWM signals to the PWM-signal amplifying unit 14.

In the PWM-signal amplifying unit 14, no gate voltage is applied to the gates of the transistors Tr1 and Tr2 since the PWM signals P1(+) and P1(−) are completely in the "low" state. Thus, the transistors Tr1 and Tr2 are turned off, stopping the switching operation. The PWM output OUT1 having a duty ratio of 50% is thereby changed to a PWM output OUT1 that remains in the "low" state after the end of the PWM cycle.

At this time, the PWM signals P2(+) and P2(−) are at the completely "low" state in the PWM-signal amplifying unit 14. Therefore, no gate voltage is applied to the gates of the transistors Tr3 and Tr4. Thus, the transistors Tr3 and Tr4 are turned off, stopping the switching operation. At the end of the PWM cycle, the PWM output OUT2 having a duty ratio of 50% is changed to a PWM output OUT2 that remains in the "low" state after the end of the PWM cycle.

Figure 6:
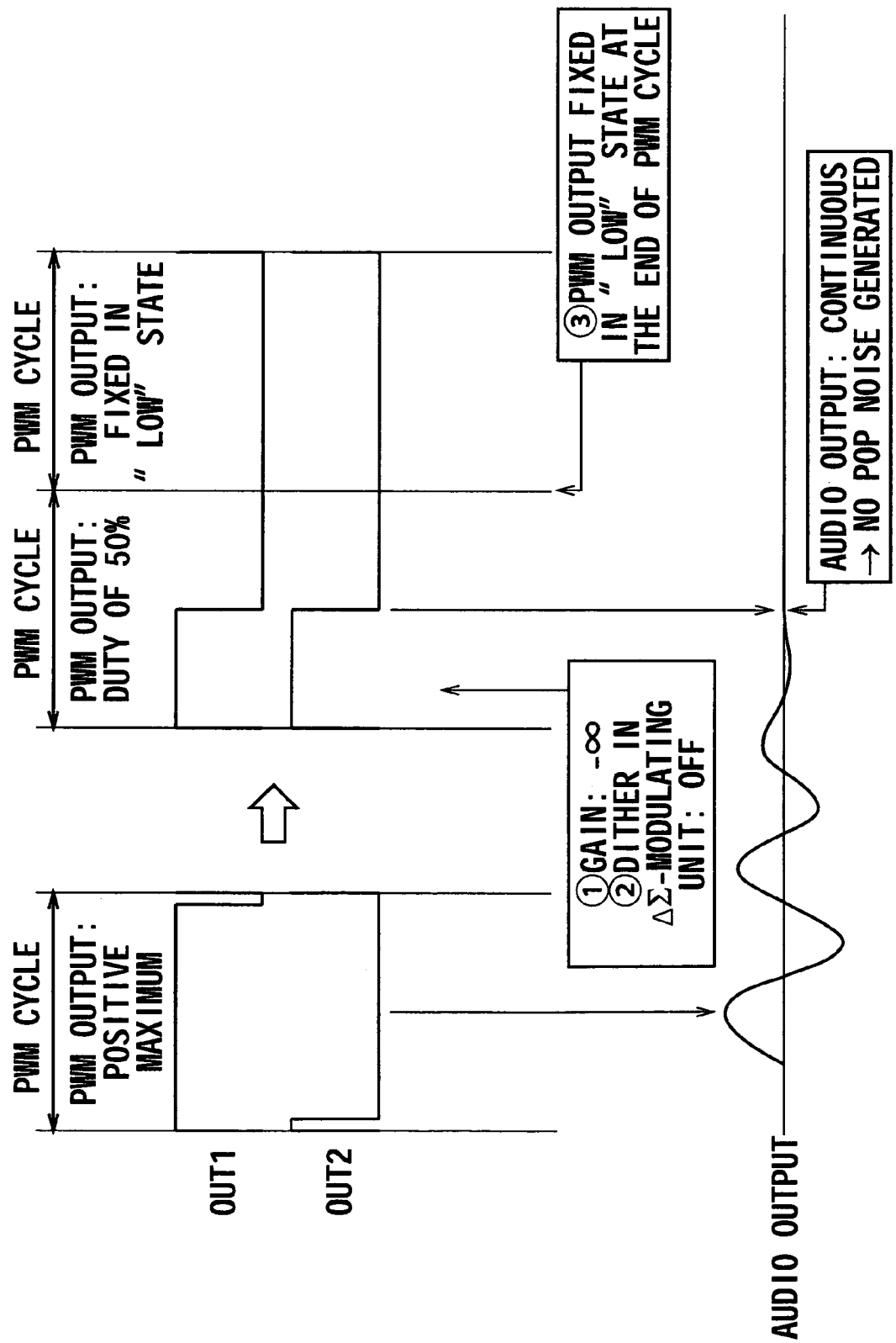
FIG. 6 is a diagram representing the mute timing in another embodiment.

In the digital amplifier apparatus 10, the PWM outputs OUT1 and OUT2 are thus set into the "low" state at the end of the PWM cycle as shown in FIG. 6. The supply of he drive currents iA and iB from the PWM-signal amplifying unit 14 is stopped, and the speaker SP completely stops generating sound.

In the embodiment described above, the control unit 16 performs the muting process and the muting-release process when the user performs the muting operation and muting-release operation, respectively. The present invention is not limited to this. Instead, the control unit 16 may automatically perform the muting-release process upon lapse of a predetermined time after the muting operation is carried out by switching the source from one to another (for example, from a CD to a radio set).

In the embodiment described above, i.e., digital amplifier apparatus 10, includes the gain control unit 11 used as gain-adjusting means, the ΔΣ-modulating unit 12 used as dither-superposing means, the PWM-signal generating unit 13 used as pulse-width-modulated signal generating means, the PWM-signal amplifying unit 14 used as amplifying means, and the control unit 16 used as control means. This invention is not limited to this configuration. The gain-adjusting means, the dither-superposing means, the pulse-width modulated signal generating means, the amplifying means, the pulse-width changing means, and the control means may have various circuit configurations other than those specified above.

The digital amplifier apparatus and the method of muting a digital amplifier apparatus, both according to the present invention, can be applied to the case where a speaker stops generating sound, without making noise at all, when a muting operation is performed to stop the speaker output, thereby switching the speaker from an acoustic state to an anacoustic state.

It should be understood by those skilled in the art that various modifications, combinations, sub-combinations and alterations may occur depending on design requirements and other factors insofar as they are within the scope of the appended claims or the equivalents thereof.

The invention claimed is:

1. A digital amplifier apparatus, comprising:
   gain-adjusting means for adjusting a gain of a digital audio signal;
   dither-superposing means for superposing a predetermined dither on the digital audio signal;
   pulse-width-modulated signal generating means for generating a pulse-width-modulated signal corresponding to the digital audio signal;
   amplifying means for causing a switching element to perform a switching operation in accordance with the pulse-width-modulated signal;
   pulse-width changing means for changing a ratio between a "high" state and a "low" state of the pulse-width modulated signal; and
   control means for performing a muting process by causing the gain-adjusting means to set the gain of the digital audio signal to a zero level, the dither-superposing means to stop superposing the dither, and the pulse-width changing means to change, step by step, the ratio between the "high" state and the "low" state of the pulse-width modulated signal toward the "low" state upon receipt of a predetermined muting signal for muting the digital audio signal, thereby maintaining the "low" state and stopping the switching operation performed in accordance with the pulse-width modulated signal.

2. The digital amplifier apparatus according to claim 1, wherein the amplifying means is an amplifier circuit of a Bridge-Tied Load (BTL) type that includes two of the switching elements for performing a switching operation in accordance with the pulse-width-modulated signal.

3. The digital amplifier apparatus according to claim 1, wherein the control means performs a muting-release process a predetermined time after performing the muting process.

4. A digital amplifier apparatus, comprising:
   gain-adjusting means for adjusting a gain of a digital audio signal;
   dither-superposing means for superposing a predetermined dither on the digital audio signal;

pulse-width-modulated signal generating means for generating a pulse-width-modulated signal corresponding to the digital audio signal;

amplifying means for causing a switching element to perform a switching operation in accordance with the pulse-width-modulated signal;

waveform-cycle end detecting means for detecting an end of each waveform cycle of the pulse-width-modulated signal; and control means for performing a muting process by causing the gain-adjusting means to set the gain of the digital audio signal to a zero level, the dither-superposing means to stop superposing the dither, and the waveform-cycle end detecting means to change a ratio between a "high" state and a "low" state of the pulse-width modulated signal toward the "low" state by using the cycle of the waveform as a trigger upon receipt of a predetermined muting signal for muting the digital audio signal, thereby maintaining the "low" state and stopping the switching operation performed in accordance with the pulse-width modulated signal.

5. A method of muting a digital amplifier that adjusts a gain of a digital audio signal, adds a predetermined dither to the digital audio signal and generates a pulse-width modulated signal corresponding to the digital audio signal having the dither added, the method comprising:

recognizing a muting command upon receiving a predetermined muting signal for muting the digital audio signal;

setting the gain of the digital audio signal to a zero level and then stopping superposing of the dither when the muting command is recognized;

generating the pulse-width modulating signal by performing a switching operation in accordance with the digital audio signal whose gain has been adjusted; and changing, step by step, a ratio between a "high" state and a "low" state of the pulse-width modulated signal toward the "low" state, thereby maintaining the "low" state and stopping the switching operation performed in accordance with the pulse-width modulated signal.

6. A method of muting a digital amplifier that adjusts a gain of a digital audio signal, adds a predetermined dither to the digital audio signal and generates a pulse-width modulated signal corresponding to the digital audio signal having the dither added, the method comprising:

recognizing a muting command upon receiving a predetermined muting signal for muting the digital audio signal;

setting the gain of the digital audio signal to a zero level and then stopping superposing of the dither when the muting command is recognized;

generating the pulse-width modulating signal by performing a switching operation in accordance with the digital audio signal whose gain has been adjusted;

detecting an end of each waveform cycle of the pulse-width-modulated signal; and changing a ratio between a "high" state and a "low" state of the pulse-width modulated signal toward the "low" state by using the cycle of the waveform detected in the waveform-cycle end detecting step as a trigger, thereby maintaining the "low" state and stopping the switching operation.

7. A digital amplifier apparatus, comprising:

a gain-adjusting section operable to adjust a gain of a digital audio signal;

a dither-superposing section operable to superpose a predetermined dither on the digital audio signal;

a pulse-width-modulated signal generating section operable to generate a pulse-width-modulated signal corresponding to the digital audio signal;

an amplifying section operable to cause a switching element to perform a switching operation in accordance with the pulse-width-modulated signal;

a pulse-width changing section operable to change a ratio between a "high" state and a "low" state of the pulse-width modulated signal; and a control section operable to perform a muting process by causing the gain-adjusting section to set the gain of the digital audio signal to a zero level, the dither-superposing section to stop superposing the dither, and the pulse-width changing section to change, step by step, the ratio between the "high" state and the "low" state of the pulse-width modulated signal toward the "low" state upon receipt of a predetermined muting signal for muting the digital audio signal, thereby maintaining the "low" state and stopping the switching operation performed in accordance with the pulse-width modulated signal.

8. A digital amplifier apparatus, comprising:

a gain-adjusting section operable to adjust a gain of a digital audio signal;

a dither-superposing section operable to superpose a predetermined dither on the digital audio signal;

a pulse-width-modulated signal generating section operable to generate a pulse-width-modulated signal corresponding to the digital audio signal;

an amplifying section operable to cause a switching element to perform a switching operation in accordance with the pulse-width-modulated signal;

a waveform-cycle end detecting section operable to detect an end of each waveform cycle of the pulse-width-modulated signal; and a control section operable to cause the gain-adjusting section to set the gain of the digital audio signal to a zero level, the dither-superposing section to stop superposing the dither, and the waveform-cycle end detecting section to change a ratio between a "high" state and a "low" state of the pulse-width modulated signal toward the "low" state by using the cycle of the waveform as a trigger upon receipt of a predetermined muting signal for muting the digital audio signal, thereby maintaining the "low" state and stopping the switching operation performed in accordance with the pulse-width modulated signal.

* * * * *

UNITED STATES PATENT AND TRADEMARK OFFICE
CERTIFICATE OF CORRECTION

| | |
|---|---|
| PATENT NO. | : 7,432,760 B2 |
| APPLICATION NO. | : 11/643627 |
| DATED | : October 7, 2008 |
| INVENTOR(S) | : Toshihiko Masuda, Yusuke Yamamoto and Arihiro Moroboshi |

Page 1 of 1

It is certified that error appears in the above-identified patent and that said Letters Patent is hereby corrected as shown below:

On the Title Page of the Patent, at Item (74), "Davis" should read --David--.

Signed and Sealed this

First Day of December, 2009

David J. Kappos
*Director of the United States Patent and Trademark Office*